United States Patent
Tseng et al.

(10) Patent No.: US 10,269,990 B2
(45) Date of Patent: Apr. 23, 2019

(54) SEMICONDUCTOR DEVICE WITH NANOSTRUCTURES AND METHODS OF FORMING THE SAME

(71) Applicant: TAIWAN SEMICONDUCTOR MANUFACTURING CO., LTD., Hsinchu (TW)

(72) Inventors: Hsin-Hsiang Tseng, Changhua County (TW); Chih-Fei Lee, Tainan (TW); Chia-Pin Cheng, Kaohsiung (TW); Fu-Cheng Chang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/469,646

(22) Filed: Mar. 27, 2017

(65) Prior Publication Data

US 2018/0166592 A1 Jun. 14, 2018

Related U.S. Application Data

(60) Provisional application No. 62/433,307, filed on Dec. 13, 2016.

(51) Int. Cl.
*H01L 31/0216* (2014.01)
*H01L 31/0232* (2014.01)
*H01L 27/146* (2006.01)
*H01L 31/112* (2006.01)

(52) U.S. Cl.
CPC .. *H01L 31/02162* (2013.01); *H01L 27/14643* (2013.01); *H01L 27/14683* (2013.01); *H01L 31/0232* (2013.01); *H01L 31/1125* (2013.01); *Y02E 10/50* (2013.01); *Y02P 70/521* (2015.11)

(58) Field of Classification Search
CPC ........... H01L 31/0232; H01L 31/02366; H01L 31/18; H01L 31/1812; H01L 31/02162–31/02165; H01L 31/204; H01L 31/02327; H01L 31/02325
See application file for complete search history.

(56) References Cited

U.S. PATENT DOCUMENTS

| | | | |
|---|---|---|---|
| 2010/0117108 A1* | 5/2010 | Gaebler | B82Y 20/00 257/98 |
| 2011/0115041 A1* | 5/2011 | Dan | H01L 27/14629 257/432 |
| 2011/0133061 A1* | 6/2011 | Yu | B82Y 15/00 250/214.1 |
| 2015/0214261 A1* | 7/2015 | Park | G02B 5/287 257/432 |
| 2017/0012078 A1* | 1/2017 | Han | H01L 27/14685 |

* cited by examiner

*Primary Examiner* — Tucker J Wright
(74) *Attorney, Agent, or Firm* — McClure, Qualey & Rodack, LLP

(57) ABSTRACT

A semiconductor device is provided, which includes a substrate and at least one nanostructure. The substrate has sensing pixels, and each of the sensing pixels has a photo sensing region for absorbing incident light. The nanostructure is directly on the photo sensing region. The nanostructure of each of the sensing pixels has a projected portion on an upper surface of the substrate, and a circle equivalent diameter of the projected portion of the nanostructure of each of the sensing pixels is substantially within a wavelength range of 100 nm to 1900 nm of the incident light configured to enter the substrate through the nanostructure.

20 Claims, 10 Drawing Sheets

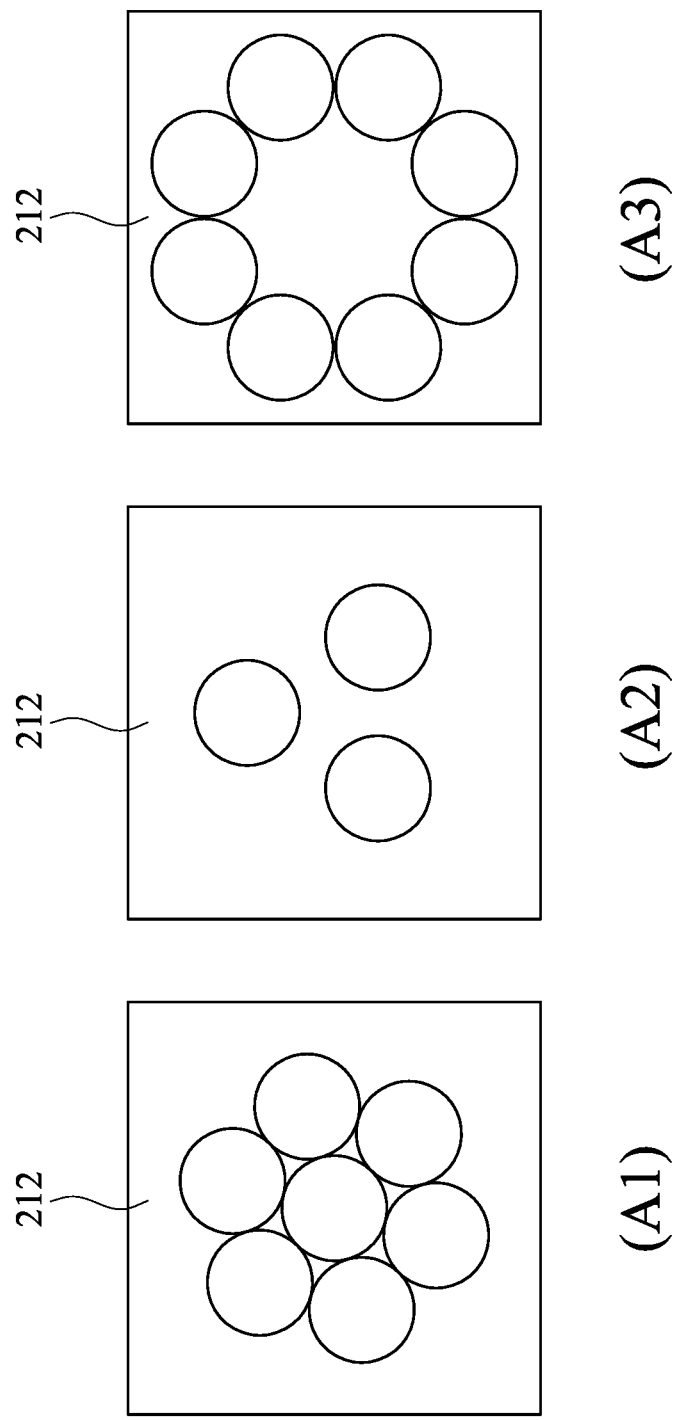

SEMICONDUCTOR DEVICE WITH NANOSTRUCTURES AND METHODS OF FORMING THE SAME

RELATED APPLICATIONS

This application claims priority to U.S. Provisional Application Ser. No. 62/433,307, filed Dec. 13, 2016, which is herein incorporated by reference.

BACKGROUND

With exponential growths of semiconductor technologies, manufacture of small size, low power consumption and high throughput semiconductor devices has been realized with a high yield rate. Among the typical semiconductor devices, image sensor devices, such as complementary metal oxide semiconductor (CMOS) image sensor devices, are widely used in various imaging applications and products, such as smart phones, digital cameras, scanners, etc. In order to meet high pixel resolution requirements, more sensing pixels are desired to be arranged in an image sensor device with a limited size, which results in decreasing of the light absorption capability and increasing of the crosstalk of the sensing pixels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A exemplarily illustrates various arrangements of nanostructures in accordance with some embodiments of the present disclosure.

DETAILED DESCRIPTION

Figure 1:
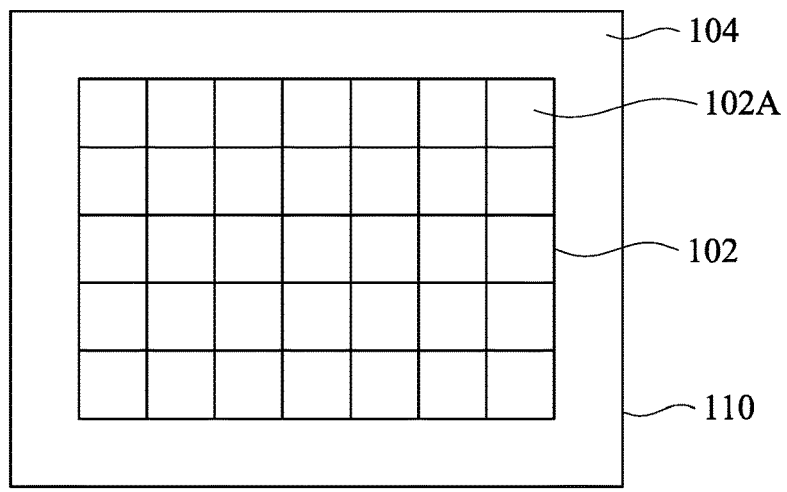
FIG. 1 is a schematic diagram of a semiconductor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Further, spatially relative terms, such as "upper," "on," "above" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "and/or" includes any and all combinations of one or more of the associated listed items. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are directed to a semiconductor device with nanostructures and methods of forming the same for improving light absorption efficiency. In particular, the semiconductor device is configured for receiving incident light including a visible light wavelength band, an infrared light wavelength band and/or an ultraviolet light wavelength band, and the circle equivalent diameters of the projected portions of the nanostructures on the upper surface of the substrate are in a predetermined range of the visible light wavelength band, an infrared light wavelength band and/or an ultraviolet light wavelength band, in order to enhance visible light, infrared light and/or ultraviolet light absorption. With the nanostructures of the present disclosure, at least the dynamic range, the light absorption capability and the noise reduction of the semiconductor device can be improved.

FIG. 1 is a schematic diagram of a semiconductor device 100 in accordance with some embodiments of the present disclosure. The semiconductor device 100 may be an image sensor device, such as a back-side illuminated (BSI) CMOS image sensor device and a front-side illuminated (FSI) CMOS image sensor device, or another similar device. The semiconductor device 100 includes a substrate 110 and circuits (not shown) formed on the substrate 110. The substrate 110 has a sensing pixel area 102 and a logic area 104 surrounding the sensing pixel area 102. The sensing pixel area 102 includes sensing pixels 102A for generating electric charges responsive to light incident thereon. Some circuits (not shown) are located in the sensing pixel area 102 for transferring electric charges generated from the sensing pixels 102A to the logic area 104. Other circuits (not shown) are located in the logic area 104 for processing output signals from the sensing pixel area 102.

Figure 2A:
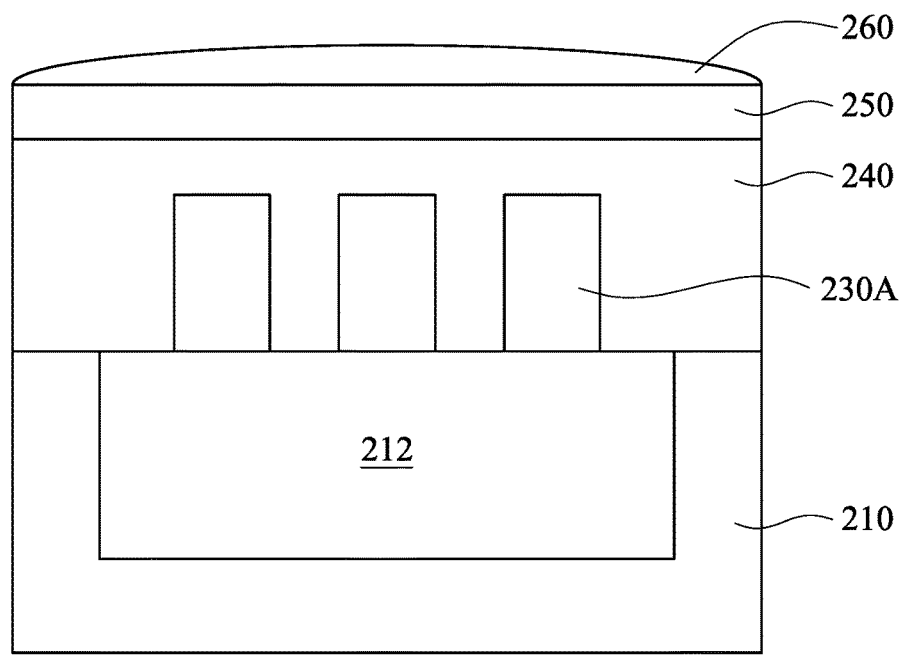
FIG. 2A is a schematic cross-sectional view of a semiconductor device in accordance with some embodiments of the present disclosure.

FIG. 2A is a schematic cross-sectional view of a semiconductor device 200A in accordance with some embodiments of the present disclosure. The semiconductor device 200A may be a portion of one or more of the sensing pixels 102A of the semiconductor device 100, a portion of any suitable type of image sensor device (e.g. a BSI or FSI CMOS image sensor device), or a portion of another suitable semiconductor device.

As shown in FIG. 2A, the semiconductor device 200A includes a substrate 210, protrusion nanostructures 230A, a dielectric layer 240, a light filter layer 250 and a microlens layer 260. The substrate 210 includes, but is not limited to, a semiconductor wafer, a silicon-on-insulator (SOI) substrate or an epitaxial substrate. In some embodiments, the substrate 210 includes an elementary semiconductor such as silicon, germanium or diamond. In various embodiments, the substrate 210 includes a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide or gallium indium phosphide.

The substrate 210 includes a photo sensing region 212 which is configured for absorbing incident light. In some embodiments, the substrate 210 is a p-type doped substrate, and the photo sensing region 212 is a doped region with n-type dopants. In certain embodiments, the substrate 210 is an n-type doped substrate, and the photo sensing region 212 is a doped region with p-type dopants.

The protrusion nanostructures 230A are directly on the photo sensing region 212. The protrusion nanostructures 230A may include, for example, silicon oxide, hafnium oxide, silicon, silicon germanium, combinations thereof, or the like. In particular, the protrusion nanostructures 230A respectively have projected portions on the upper surface of the substrate 210, and the circle equivalent diameter of each of the projected portions is between 100 nm and 1900 nm. The circle equivalent diameter $D_e$ is defined by equation: $D_e=(4A/\pi)^{1/2}$, where A is the area of the projected portion of the protrusion nanostructure. If the semiconductor device 200A is configured for sensing visible light, the circle equivalent diameter may be between 400 nm and 700 nm. If the semiconductor device 200A is configured for sensing infrared light, the circle equivalent diameter may be between 700 nm and 1900 nm. If the semiconductor device 200A is configured for sensing ultraviolet light, the circle equivalent diameter may be between 100 nm and 400 nm. In addition, the protrusion nanostructures 230A may have the same or different circle equivalent diameters and/or heights.

The dielectric layer 240 is disposed on the substrate 210 and covers the protrusion nanostructures 230A. The dielectric layer 240 may include undoped silica glass (USG), hafnium oxide, silicon, silicon germanium, combinations thereof, or the like. In some embodiments, the dielectric layer 240 may include multiple layers.

The light filter layer 250 is disposed on the dielectric layer 240. The light filter layer 250 is used to allow light components in a particular wavelength band to penetrate therethrough and block unwanted light components. The passing wavelength band of the light filter layer 250 may be a red light wavelength band, a green light wavelength band, a blue light wavelength band, an infrared light wavelength band, an ultraviolet light wavelength band, or combinations thereof, but is not limited thereto. The light filter layer 250 may include, such as pigment-based polymer, dye-based polymer, resin and another suitable material.

The microlens layer 260 is disposed on the light filter layer 250, and has a convex shape at its light receiving side for improving light receiving efficiency. The microlens layer 260 may include glass, acrylic polymer or another suitable material with high transmittance.

Figure 2B:
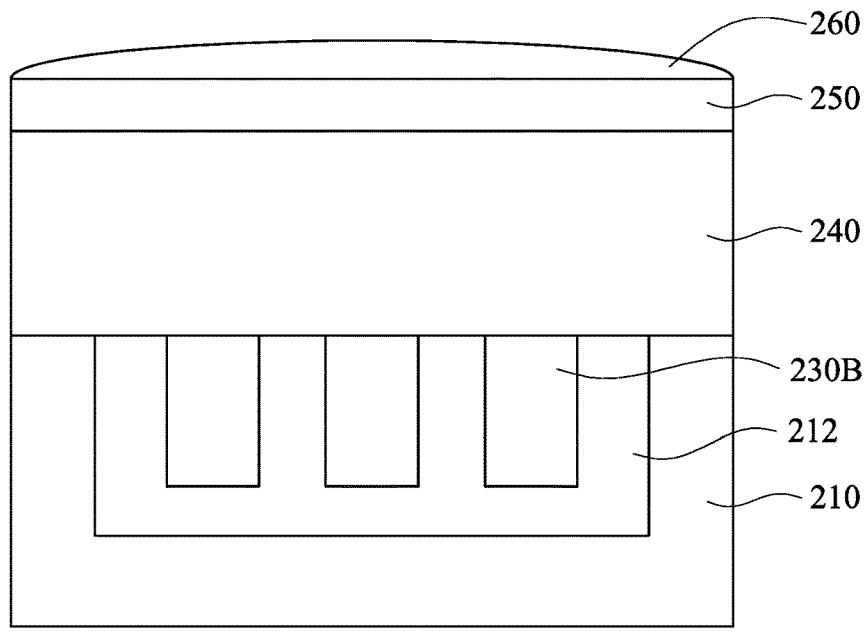
FIG. 2B is a schematic cross-sectional view of a semiconductor device in accordance with certain embodiments of the present disclosure.

FIG. 2B is a schematic cross-sectional view of a semiconductor device 200B in accordance with certain embodiments of the present disclosure. The semiconductor device 200B may be a portion of one or more of the sensing pixels 102A of the semiconductor device 100, a portion of any suitable type of image sensor device (e.g. BSI or FSI CMOS image sensor device), or a portion of another suitable semiconductor device. The difference between the semiconductor devices 200A and 200B is that the semiconductor device 200A includes embedded nanostructures 230B in the photo sensing region 212 rather than the protrusion nanostructures 230A. The embedded nanostructures 230B may include, for example, silicon oxide, hafnium oxide, silicon, silicon germanium, combinations thereof, or the like. In particular, the protrusion nanostructures 230B respectively have projected portions on the upper surface of the substrate 210, and the circle equivalent diameter of each of the projected portions is between 100 nm and 1900 nm. The circle equivalent diameter $D_e$ is defined by equation: $D_e=(4A/\pi)^{1/2}$, where A is the area of the projected portion of the protrusion nanostructure. If the semiconductor device 200B is configured for sensing visible light, the circle equivalent diameter may be between 400 nm and 700 nm. If the semiconductor device 200B is configured for sensing infrared light, the circle equivalent diameter may be between 700 nm and 1900 nm. If the semiconductor device 200B is configured for sensing ultraviolet light, the circle equivalent diameter may be between 100 nm and 400 nm. In addition, the protrusion nanostructures 230B may have the same or different circle equivalent diameters and/or heights. Detailed descriptions of the other elements the semiconductor devices 200B (i.e. the substrate 210, the dielectric layer 240, the light filter layer 250 and the microlens layer 260) are as illustrated above for FIG. 2A, and are not repeated herein.

Figure 2C:
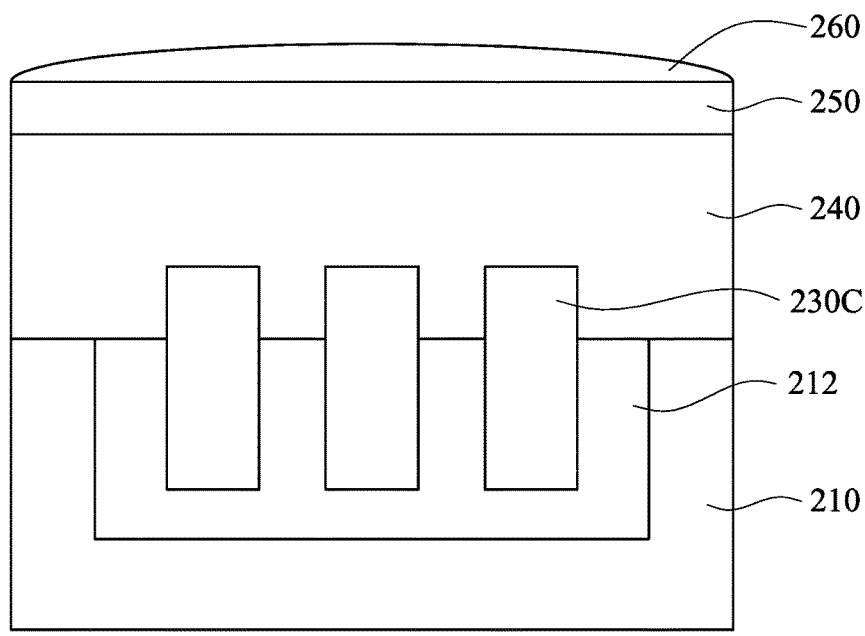
FIG. 2C is a schematic cross-sectional view of a semiconductor device in accordance with some embodiments of the present disclosure.

FIG. 2C is a schematic cross-sectional view of a semiconductor device 200C in accordance with some embodiments of the present disclosure. The semiconductor device 200C may be a portion of one or more of the sensing pixels 102A of the semiconductor device 100, a portion of any suitable type of image sensor device (e.g. BSI or FSI CMOS image sensor device), or a portion of another suitable semiconductor device. The difference between the semiconductor devices 200A and 200C is that the semiconductor device 200C includes embedded nanostructures 230C partially in the photo sensing region 212 and partially above the upper surface of the substrate 210 rather than the protrusion nanostructures 230A. The protrusion nanostructures 230C may include, for example, silicon oxide, hafnium oxide, silicon, silicon germanium, combinations thereof, or the like. In particular, the protrusion nanostructures 230C respectively have projected portions on the upper surface of the substrate 210, and the circle equivalent diameter of each of the projected portions is between 100 nm and 1900 nm. The circle equivalent diameter $D_e$ is defined by equation:

$D_e = (4A/\pi)^{1/2}$, where A is the area of the projected portion of the protrusion nanostructure. If the semiconductor device 200C is configured for sensing visible light, the circle equivalent diameter may be between 400 nm and 700 nm. If the semiconductor device 200C is configured for sensing infrared light, the circle equivalent diameter may be between 700 nm and 1900 nm. If the semiconductor device 200C is configured for sensing ultraviolet light, the circle equivalent diameter may be between 100 nm and 400 nm. In addition, the protrusion nanostructures 230C may have the same or different circle equivalent diameters, heights of the portions partially in the photo sensing region 212 and/or height of the portions partially above the upper surface of the substrate 210. Detailed descriptions of the other elements the semiconductor devices 200C (i.e. the substrate 210, the dielectric layer 240, the light filter layer 250 and the microlens layer 260) are as illustrated above for FIG. 2A, and are not repeated herein.

As exemplarily illustrated in FIG. 2A through FIG. 2C, the protrusion nanostructures 230A and the embedded nanostructures 230B and 230C are pillar-shaped. In some other embodiments, some of the protrusion nanostructures 230A, the embedded nanostructures 230B and/or the embedded nanostructures 230C are pillar-shaped, and the others of the protrusion nanostructures 230A, the embedded nanostructures 230B and/or the embedded nanostructures 230C are cone-shaped. In certain other embodiments, the protrusion nanostructures 230A, the embedded nanostructures 230B and/or the embedded nanostructures 230C are cone-shaped.

FIG. 3A exemplarily illustrates various arrangements of the protrusion nanostructures 230A or the embedded nanostructures 230B or 230C on the photo sensing region 212 in accordance with some embodiments of the present disclosure. As shown in FIG. 3A, the arrangement of the protrusion nanostructures 230A or the embedded nanostructures 230B or 230C may be a hexagonal close packing arrangement (A1), an octagonal arrangement (A2) or a triangular arrangement (A3). The protrusion nanostructures 230A or the embedded nanostructures 230B or 230C may have one or more side views of a hexagonal close packing arrangement, an octagonal arrangement, a triangular arrangement, combinations thereof, or another suitable arrangement.

Figure 3B:
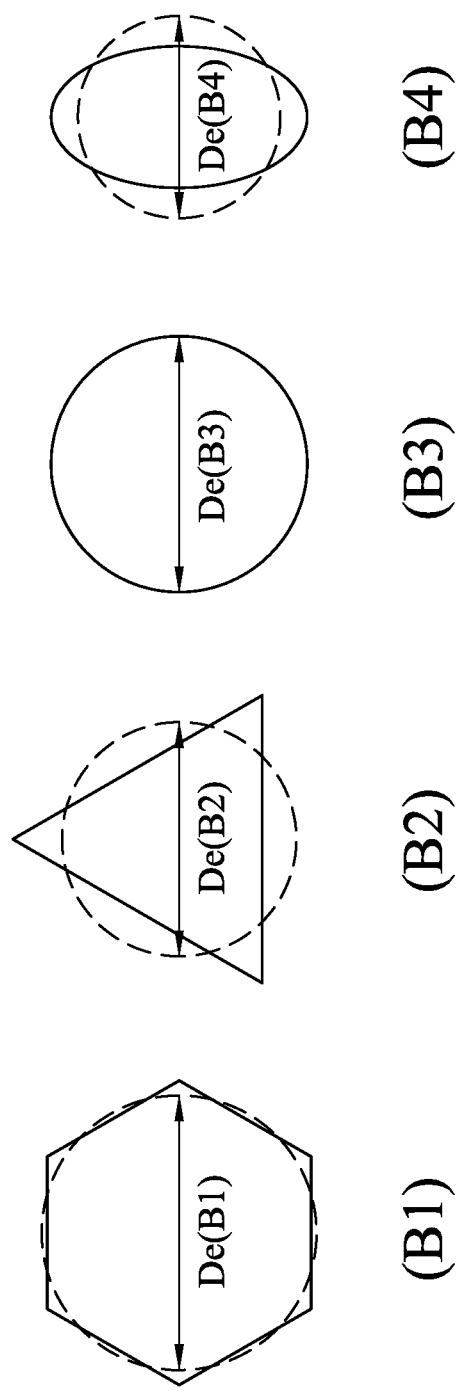
FIG. 3B exemplarily illustrates various top-view shapes of nanostructures in accordance with some embodiments of the present disclosure.

FIG. 3B exemplarily illustrates various top-view shapes of the protrusion nanostructures 230A or the embedded nanostructures 230B or 230C in accordance with some embodiments of the present disclosure. As shown in FIG. 3B, the top-view shape of each of the protrusion nanostructures 230A or the embedded nanostructures 230B or 230C may be a hexagonal shape (B1), a triangular shape (B2), a circular shape (B3) or an elliptical shape (B4). The hexagonal shape (B1), the triangular shape (B2), the circular shape (B3) or the elliptical shape (B4) respective have circle equivalent diameters De(B1), De(B2), De(B3) and De(B4). The top-view shapes of the protrusion nanostructures 230A or the embedded nanostructures 230B or 230C may be the same or different. In other words, the protrusion nanostructures 230A or the embedded nanostructures 230B or 230C may have one or more top-view shapes of a hexagonal shape, a triangular shape, a circular shape, an elliptical shape, combinations thereof, or another suitable shape.

Figure 3C:
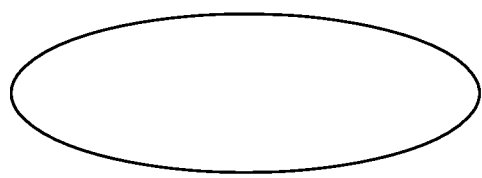
FIG. 3C exemplarily illustrates various side-view shapes of nanostructures in accordance with some embodiments of the present disclosure.
Figure 3C:
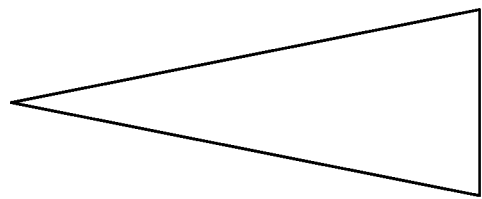
Figure 3C:
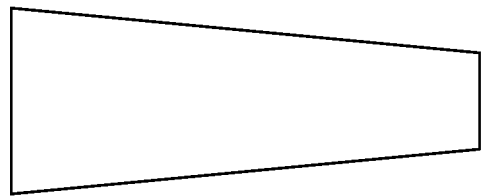
Figure 3C:
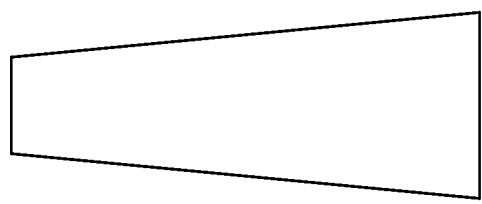
Figure 3C:
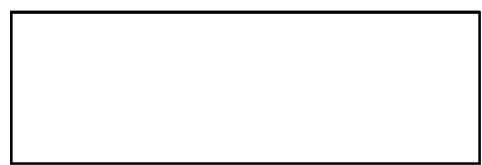

FIG. 3C exemplarily illustrates various side-view shapes of the protrusion nanostructures 230A or the embedded nanostructures 230B or 230C in accordance with some embodiments of the present disclosure. As shown in FIG. 3C, the side-view shape of each of the protrusion nanostructures 230A or the embedded nanostructures 230B or 230C may be a rectangular shape (C1), a trapezoid shape (C2), a reverse trapezoid shape (C3), a triangular shape (C4) or an elliptical shape (C5). The side-view shapes of the protrusion nanostructures 230A or the embedded nanostructures 230B or 230C may be the same or different. In other words, the protrusion nanostructures 230A or the embedded nanostructures 230B or 230C may have one or more side-view shapes of a rectangular shape, a trapezoid shape, a reverse trapezoid shape, a triangular shape, an elliptical shape, or combinations thereof.

Note that the arrangement, the top-view shapes and/or the side-view shapes of the protrusion nanostructures 230A or the embedded nanostructures 230B or 230C may be adjusted or modified based on particular design requirements other than those illustrated in FIG. 3A to FIG. 3C. In addition, the protrusion nanostructures 230A or the embedded nanostructures 230B or 230C may have two or more different arrangements. For example, the protrusion nanostructures 230A or the embedded nanostructures 230B or 230C may include a triangular arrangement and a hexagonal arrangement. Furthermore, for an image sensor device adopting the semiconductor device 200A, 200B and/or 200C for its sensing pixels, the arrangements, the top-view shapes and/or the side-view shapes of the protrusion nanostructures 230A or the embedded nanostructures 230B or 230C of the sensing pixels may be the same or different.

Figure 4A:
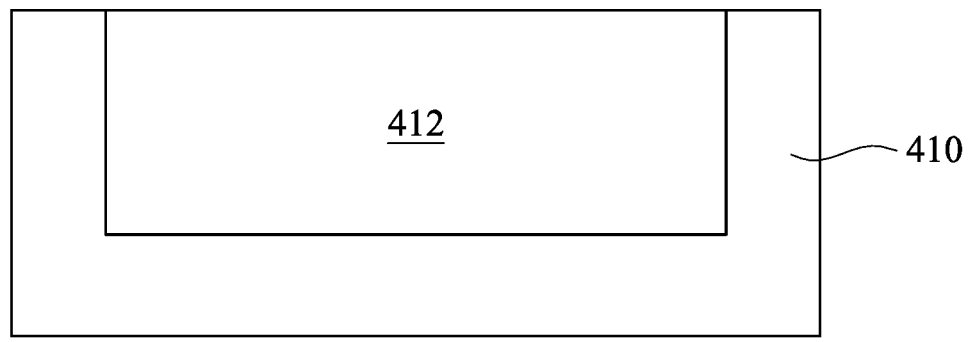
FIG. 4A to FIG. 4F are schematic cross-sectional views of intermediate stages in the formation of a semiconductor device in accordance with some embodiments of the present disclosure.

FIG. 4A to FIG. 4F are schematic cross-sectional views of intermediate stages in the formation of a semiconductor device in accordance with some embodiments of the present disclosure. In FIG. 4A, a substrate 410 is provided, which includes a photo sensing region 412. The substrate 410 may be, for example, an SOI substrate or an epitaxial substrate. In some embodiments, the substrate 410 is formed further including an elementary semiconductor such as silicon, germanium and diamond. In various embodiments, the substrate 410 is formed further including a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide and gallium indium phosphide.

The photo sensing region 412 is formed for absorbing incident light. In some embodiments, the substrate 410 is a p-type doped substrate, and the photo sensing region 412 is a doped region with n-type dopants. In certain embodiments, the substrate 410 is an n-type doped substrate, and the photo sensing region 412 is a doped region with p-type dopants. The photo sensing region 412 may be formed by an ion implantation process, a diffusion process, or another suitable process.

Figure 4B:
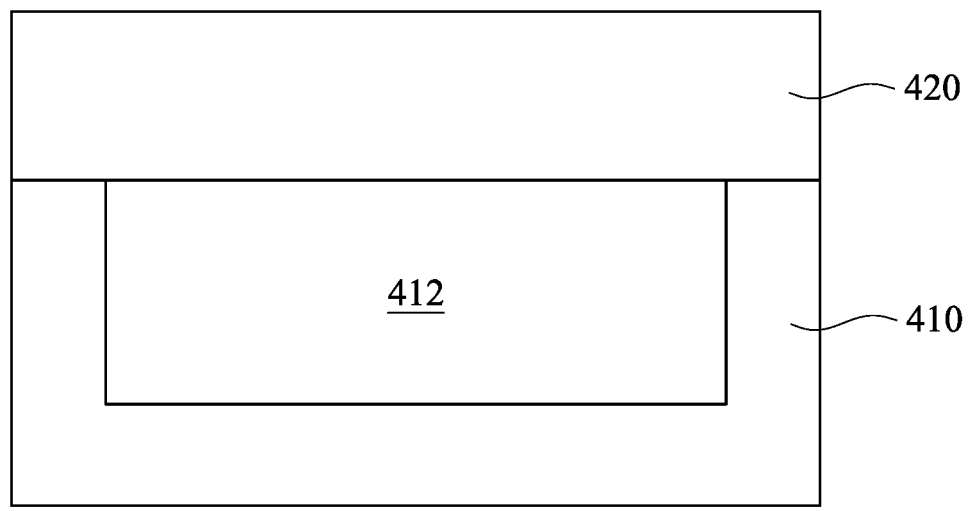

In FIG. 4B, a nanostructure layer 420 is formed on the substrate 410. The nanostructure layer 420 may be formed from, for example, silicon oxide, hafnium oxide, silicon, silicon germanium, combinations thereof, or the like. The nanostructure layer 420 may be formed by a deposition process such as a physical vapor deposition (PVD) process, a chemical vapor deposition (CVD) process, a low pressure CVD (LPCVD) process, a plasma enhanced CVD (PECVD) process, a high density plasma CVD (HDPCVD) process, an atomic layer deposition (ALD) process, a spin-on coating process, a sputtering process, and/or another suitable process.

Figure 4C:
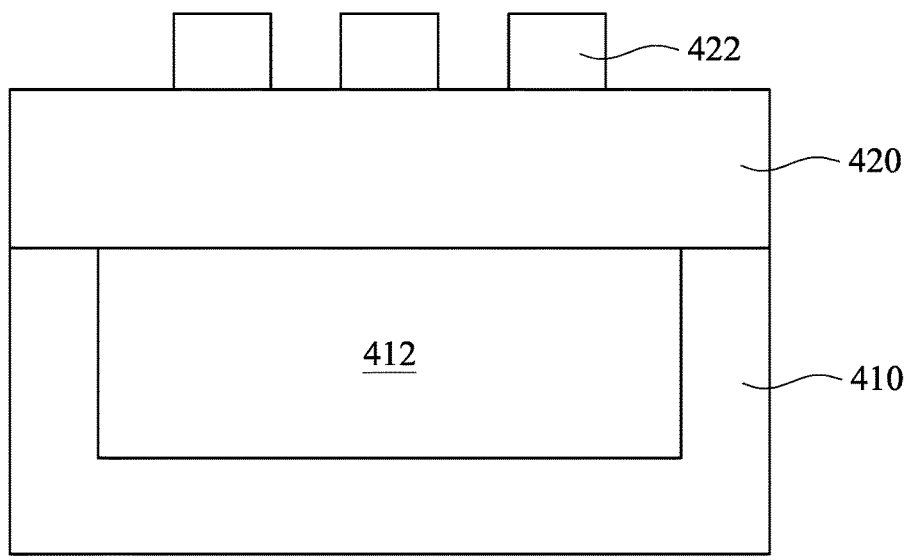

In FIG. 4C, a patterned photoresist layer 422 is formed on the nanostructure layer 420 and above the photo sensing region 412 of the substrate 410 to define etching portions of the nanostructure layer 420. Projected portions of the patterned photoresist layers 422 on the substrate 410 are within the upper surface of the photo sensing region 412.

Figure 4D:
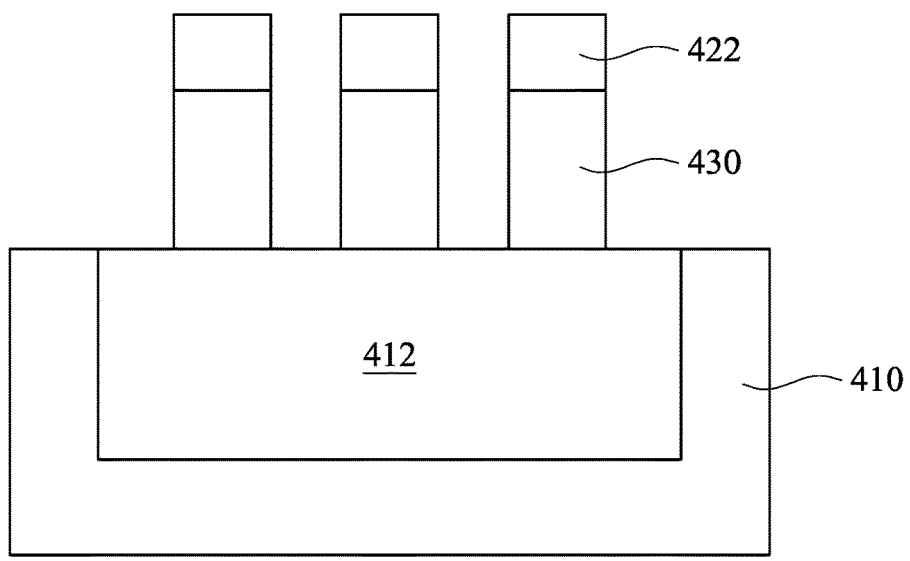

In FIG. 4D, some portions of the nanostructure layer 420 uncovered by the patterned photoresist layers 422 is removed, so as to form protrusion nanostructures 430. The etching process may be an isotropic etching process or an anisotropic etching process with low selectivity with respect to the substrate 410 and the photo sensing region 412, such as a reactive ion etching process, a plasma etching process, a dry etching process, and wet etching process, but is not limited thereto. In some embodiments, the protrusion nanostructures 430 are formed without exposing the substrate 410 and the photo sensing region 412.

In particular, each of the protrusion nanostructures 430 is formed having a projected portion on the upper surface of the substrate 410. A circle equivalent diameter of the projected portion is between 100 nm and 1900 nm. The circle equivalent diameter of the projected portion may be between 400 nm and 700 nm for enhancing visible light absorption, or may be between 700 nm and 1900 nm for enhancing infrared light absorption, or may be between 100 nm and 400 nm for enhancing ultraviolet light absorption. In addition, the protrusion nanostructures 430 may be formed having the same or different circle equivalent diameters and/or heights.

Moreover, the protrusion nanostructures 430 may be formed having one or more of the arrangements, the top-view shapes and the side-view shapes respectively illustrated in FIG. 3A to FIG. 3C, or other arrangement(s), top-view shape(s) and/or side-view shape(s).

Figure 4E:
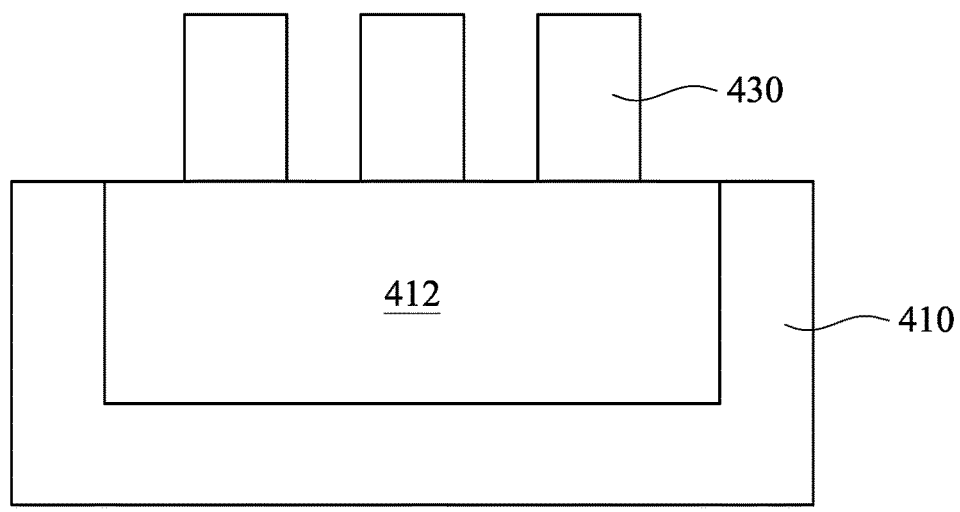

In FIG. 4E, after the etching process on the nanostructure layer 420, the patterned photoresist layers 422 is then stripped. The patterned photoresist layers 422 may be removed by a dry etching process, a wet etching process, a plasma ashing process or another suitable process.

As exemplarily illustrated in FIG. 4E, the protrusion nanostructures 430 are pillar-shaped. In some other embodiments, some of the protrusion nanostructures 430 are pillar-shaped, and the others of the protrusion nanostructures 430 are cone-shaped. In certain other embodiments, the protrusion nanostructures 430 are cone-shaped.

Figure 4F:
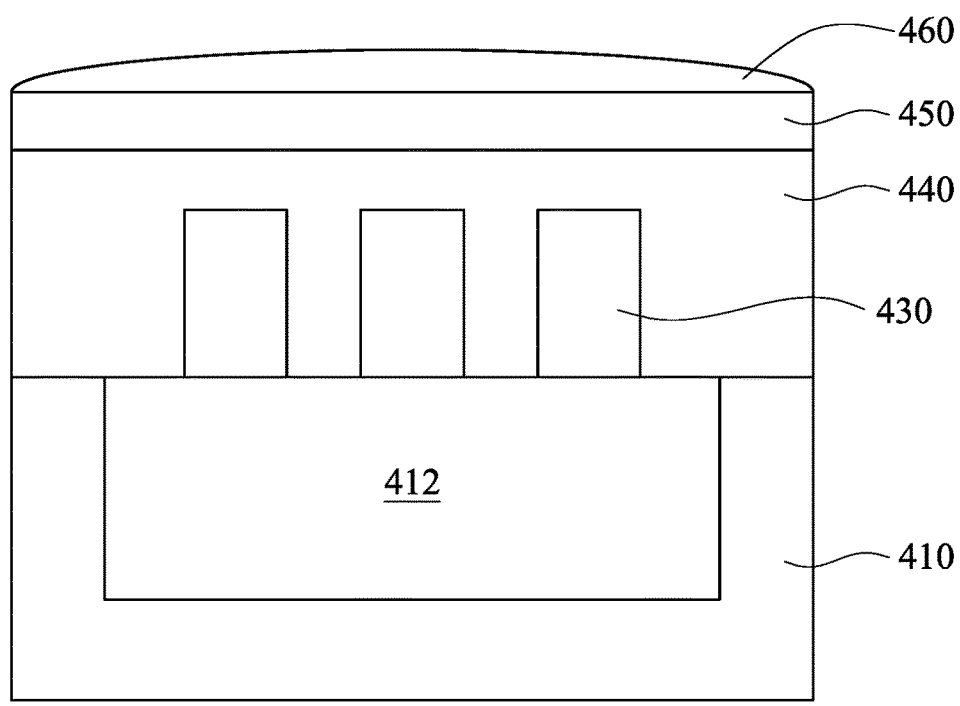

In FIG. 4F, a dielectric layer 440 is formed on the substrate 410 and covering the protrusion nanostructures 430, and a light filter layer 450 and a microlens layer are sequentially formed on the dielectric layer 440. The dielectric layer 440 may be formed from USG, hafnium oxide, silicon, silicon germanium, combinations thereof, or the like. The dielectric layer 440 may be formed by a deposition process such as a PVD process, a CVD process, an LPCVD process, a PECVD process, an HDPCVD process, an ALD process, a spin-on coating process, a sputtering process, and/or another suitable process. In alternative embodiments, the dielectric layer 440 is a vacuum layer. Moreover, in some embodiments, the dielectric layer 440 may be formed including multiple layers.

The light filter layer 450 is formed for allowing light components in a particular wavelength band to penetrate therethrough and blocking unwanted light components. The passing wavelength band of the light filter layer 450 may be a red light wavelength band, a green light wavelength band, a blue light wavelength band, an infrared light wavelength band, an ultraviolet light wavelength band, or combinations thereof, but is not limited thereto. The light filter layer 450 may be formed form a material, such as pigment-based polymer, dye-based polymer, resin and another suitable material. The light filter layer 450 may be formed by a coating process or another suitable process.

The microlens layer 460 is formed having a convex shape at its light receiving side for improving light receiving efficiency. The microlens layer 460 may be formed from glass, acrylic polymer or another suitable material with high transmittance. The microlens layer 460 may be formed by a spin-on process, a CVD process, a PVD process, and/or another suitable process.

Figure 5A:
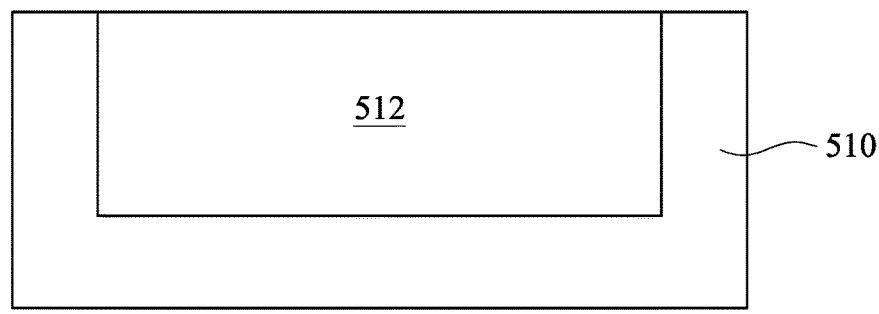
FIG. 5A to FIG. 5E are schematic cross-sectional views of intermediate stages in the formation of a semiconductor device in accordance with certain embodiments of the present disclosure.

FIG. 5A to FIG. 5E are schematic cross-sectional views of intermediate stages in the formation of a semiconductor device in accordance with some embodiments of the present disclosure. In FIG. 5A, a substrate 510 is provided, which includes a photo sensing region 512. The substrate 510 may be, for example, an SOI substrate or an epitaxial substrate. In some embodiments, the substrate 510 is formed further including an elementary semiconductor such as silicon, germanium and diamond. In various embodiments, the substrate 510 is formed further including a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide and gallium indium phosphide.

The photo sensing region 512 is formed for absorbing incident light. In some embodiments, the substrate 510 is a p-type doped substrate, and the photo sensing region 512 is a doped region with n-type dopants. In certain embodiments, the substrate 510 is an n-type doped substrate, and the photo sensing region 512 is a doped region with p-type dopants. The photo sensing region 512 may be formed by an ion implantation process, a diffusion process, or another suitable process.

Figure 5B:
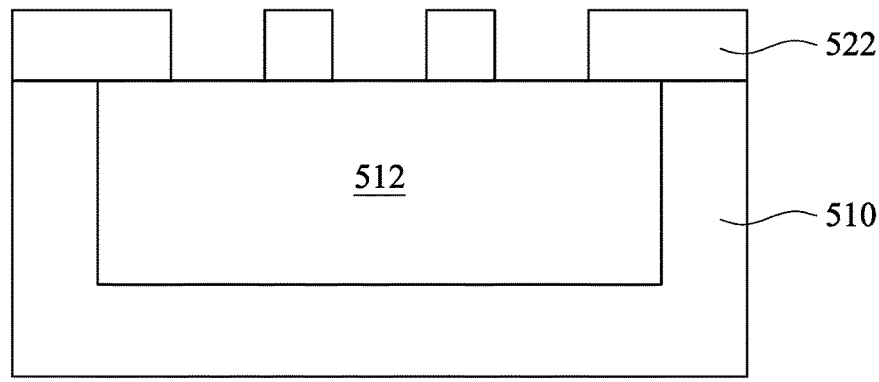

In FIG. 5B, a patterned photoresist layer 522 is formed on the substrate 510 and the photo sensing region 512. The patterned photoresist layer 522 has openings which define etching portions of the photo sensing region 512. The patterned photoresist layer 522 may be formed from a positive material and patterned by a clear tone mask. In some other embodiments, the patterned photoresist layer 522 may be formed from a negative material and patterned by a dark tone mask.

Figure 5C:
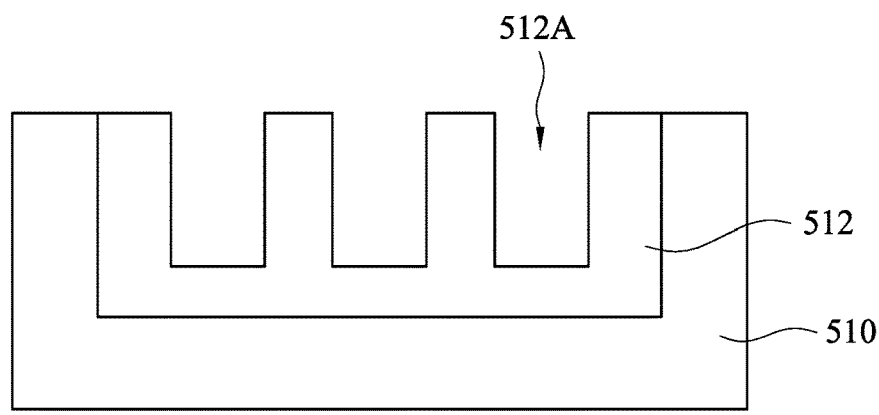

In FIG. 5C, the etching portions of the photo sensing region 512 uncovered by the patterned photoresist layer 522 are removed, so as to form recesses 512A. The etching process may be an isotropic etching process or an anisotropic etching process, such as a reactive ion etching process, a plasma etching process, a dry etching process, and wet etching process, but is not limited thereto. After the recesses 512A are formed, the patterned photoresist layer 522 is then stripped. The patterned photoresist layer 522 may be removed by a dry etching process, a wet etching process, a plasma ashing process or another suitable process.

Figure 5D:
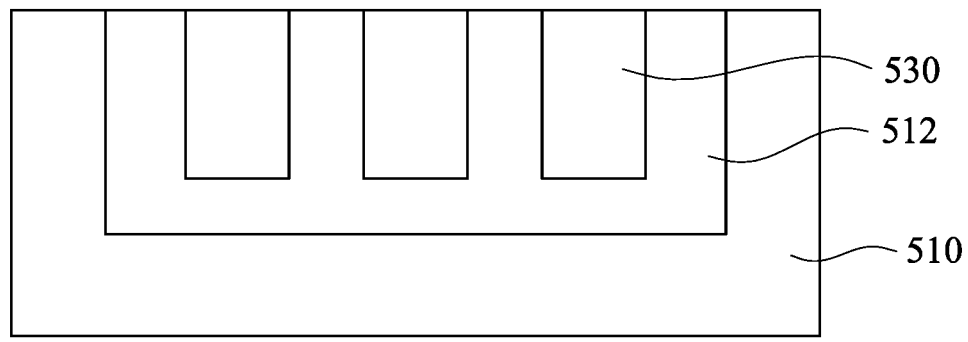

In FIG. 5D, a material is filled into the recesses 512A to form embedded nanostructures 530. The embedded nanostructures 530 may be formed from, for example, silicon oxide, hafnium oxide, silicon, silicon germanium, combinations thereof, or the like. The embedded nanostructures 530 may be formed by a deposition process such as a PVD process, a CVD process, an LPCVD process, a PECVD process, an HDPCVD process, an ALD process, a spin-on coating process, a sputtering process, and/or another suitable process. In some embodiments, an extra planarization process may be performed to planarize the upper surfaces of the embedded nanostructures 530.

As exemplarily illustrated in FIG. 5D, the embedded nanostructures 530 are pillar-shaped. In some other embodiments, some of the embedded nanostructures 530 are pillar-shaped, and the others of the embedded nanostructures 530 are cone-shaped or reverse cone-shaped. In certain other embodiments, the embedded nanostructures 530 are cone-shaped or reverse cone-shaped.

In particular, each of the embedded nanostructures 530 is formed having a projected portion on the upper surface of the substrate 510. A circle equivalent diameter of the projected portion is between 100 nm and 1900 nm. The circle equivalent diameter of the projected portion may be between 400 nm and 700 nm for enhancing visible light absorption, or may be between 700 nm and 1900 nm for enhancing infrared light absorption, or may be between 100 nm and 400 nm for enhancing ultraviolet light absorption. In addition, the embedded nanostructures 530 may be formed having the same or different circle equivalent diameters and/or heights.

Moreover, the embedded nanostructures 530 may be formed having one or more of the arrangements, the top-view shapes and the side-view shapes respectively illustrated in FIG. 3A to FIG. 3C, or other arrangement(s), top-view shape(s) and/or side-view shape(s).

In some other embodiments, the top of the embedded nanostructures 530 may be higher than the upper surface of the substrate 510. In such case, extra processes (including a photoresist patterning process and an etching process) may be performed to form the embedded nanostructures 530 which higher tops than the upper surface of the substrate 510. The extra processes are similar to those illustrated in FIG. 4C to FIG. 4E, and thus detailed descriptions thereof are not repeated herein.

Figure 5E:
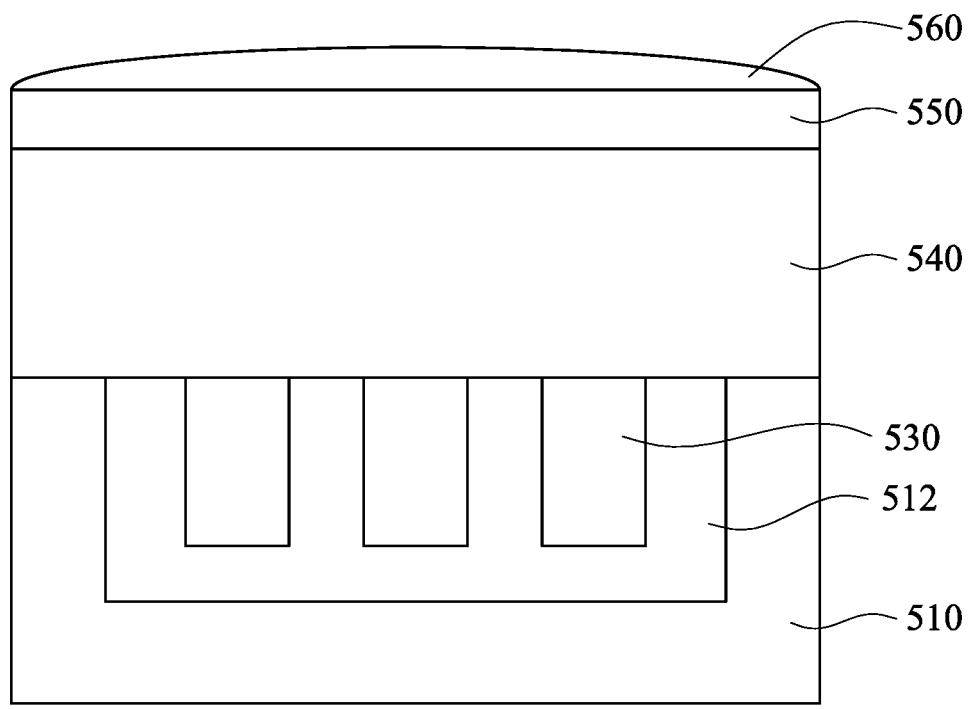

In FIG. 5E, a dielectric layer 540, a light filter layer 550 and a microlens layer are sequentially formed on the substrate 510 and the embedded nanostructures 530. The dielectric layer 540 may be formed from USG, hafnium oxide, silicon, silicon germanium, combinations thereof, or the like. The dielectric layer 540 may be formed by a deposition process such as a PVD process, a CVD process, an LPCVD process, a PECVD process, an HDPCVD process, an ALD process, a spin-on coating process, a sputtering process, and/or another suitable process. In alternative embodiments, the dielectric layer 540 is a vacuum layer. Moreover, in some embodiments, the dielectric layer 540 may be formed including multiple layers.

The light filter layer 550 is formed for allowing light components in a particular wavelength band to penetrate therethrough and blocking unwanted light components. The passing wavelength band of the light filter layer 550 may be a red light wavelength band, a green light wavelength band, a blue light wavelength band, an infrared light wavelength band, an ultraviolet light wavelength band, or combinations thereof, but is not limited thereto. The light filter layer 550 may be formed form a material, such as pigment-based polymer, dye-based polymer, resin and another suitable material. The light filter layer 550 may be formed by a coating process or another suitable process.

The microlens layer 560 is formed having a convex shape at its light receiving side for improving light receiving efficiency. The microlens layer 560 may be formed from glass, acrylic polymer or another suitable material with high transmittance. The microlens layer 560 may be formed by a spin-on process, a CVD process, a PVD process, and/or another suitable process.

In accordance with some embodiments, a semiconductor device is provided, which includes a substrate and at least one nanostructure. The substrate has sensing pixels, and each of the sensing pixels has a photo sensing region for absorbing incident light. The nanostructure is directly on the photo sensing region, and has a projected portion on an upper surface of the substrate. A circle equivalent diameter of the projected portion is substantially within a wavelength range of 100 nm to 1900 nm of the incident light configured to enter the substrate through the nanostructure. The circle equivalent diameter $D_e$ is defined by equation $D_e=(4A/\pi)^{1/2}$, where A is an area of the projected portion of the nanostructure.

In accordance with certain embodiments, a method for forming a semiconductor device includes the following steps. A substrate is provided having sensing pixels, and each of the sensing pixels has a photo sensing region for absorbing incident light. At least one protrusion nanostructure is directly formed on the photo sensing region. The protrusion nanostructure is formed having a projected portion on an upper surface of the substrate. A circle equivalent diameter of the projected portion is substantially within a predetermined wavelength range of 100 nm to 1900 nm of the incident light configured to enter the substrate through the protrusion nanostructure. The circle equivalent diameter $D_e$ is defined by equation $D_e=(4A/\pi)^{1/2}$, where A is an area of the projected portion of the protrusion nanostructure.

In accordance with some embodiments, a method for forming a semiconductor device includes the following steps. A substrate is provided having sensing pixels, and each of the sensing pixels has a photo sensing region for absorbing incident light. At least one recess is formed in the photo sensing region of each of the sensing pixels. The recess is filled with a material to form an embedded nanostructure. The embedded nanostructure is formed having a projected portion on an upper surface of the substrate. A circle equivalent diameter of the projected portion is substantially within a predetermined wavelength range of 100 nm to 1900 nm of the incident light configured to enter the substrate through the embedded nanostructure. The circle equivalent diameter $D_e$ is defined by equation $D_e=(4A/\pi)^{1/2}$, where A is an area of the projected portion of the embedded nanostructure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate having a plurality of sensing pixels, each of the sensing pixels having a photo sensing region for absorbing incident light; and
    a plurality of nanostructures directly on the photo sensing region and arranged in a hexagonal arrangement, an octagonal arrangement, a triangular arrangement, or combinations thereof.

2. The semiconductor device of claim 1, wherein at least one of the nanostructures comprises silicon oxide, hafnium oxide, silicon, silicon germanium, or combinations thereof.

3. The semiconductor device of claim 1, wherein at least one of the nanostructures comprises at least one protrusion nanostructure on the upper surface of the substrate.

4. The semiconductor device of claim 1, further comprising:

a dielectric layer on the substrate and covering at least one of the nanostructures; and a microlens layer on the dielectric layer.

5. The semiconductor device of claim 4, wherein the dielectric layer comprises silicon oxide, undoped silica glass (USG), hafnium oxide, silicon, silicon germanium, vacuum, or combinations thereof.

6. The semiconductor device of claim 1, wherein the sensing pixels comprises a plurality of visible light sensing pixels, at least one of nanostructures has a projected portion on an upper surface of the substrate, and a circle equivalent diameter of the projected portion is in a range of about 400 nm to about 700 nm.

7. The semiconductor device of claim 1, wherein at least one of the nanostructures is pillar-shaped.

8. The device of claim 1, wherein at least one of the nanostructures has a projected portion on an upper surface of the substrate and a circle equivalent diameter of the projected portion is substantially within a range from about 100 nm to about 1900 nm.

9. The device of claim 1, wherein at least one of the nanostructures has a projected portion on an upper surface of the substrate and a circle equivalent diameter De of the projected portion is defined by equation $De=(4A/\pi)^{1/2}$, where A is an area of the projected portion.

10. A device, comprising:
a substrate having a plurality of sensing pixels, each of the sensing pixels having a photo sensing region;
a plurality of nanostructures directly on the photo sensing region, wherein the nanostructures are arranged in a polygonal arrangement;
a dielectric layer over the nanostructures;
a light filter layer over the dielectric layer; and
a microlens layer over the dielectric layer.

11. The device of claim 10, wherein at least one nanostructures has a projected portion on an upper surface of the photo sensing region, a circle equivalent diameter of the projected portion is in a range from about 100 nm to about 1900 nm, and the circle equivalent diameter of the projected portion is defined by equation $De=(4A/\pi)^{1/2}$, where De is the circle equivalent diameter of the projected portion and A is an area of the projected portion.

12. The device of claim 10, wherein the microlens layer is superimposed over at least one of the nanostructures.

13. The device of claim 10, wherein the light filter layer has a passband, at least one of the nanostructures has a projected portion on an upper surface of the photo sensing region, a circle equivalent diameter of the projected portion is substantially within the passband of the light filter layer, and the circle equivalent diameter of the projected portion is defined by equation $De=(4A/\pi)^{1/2}$, where De is the circle equivalent diameter of the projected portion and A is an area of the projected portion.

14. The device of claim 10, wherein at least one of the nanostructures protrudes from a top surface of the photo sensing region.

15. The device of claim 10, wherein the nanostructures are spaced from each other.

16. The device of claim 10, wherein the nanostructures are in contact with each other.

17. A device, comprising:
a substrate having a plurality of sensing pixels, each of the sensing pixels having a photo sensing region;
a plurality of nanostructures over the photo sensing region, wherein the nanostructures are in contact with each other, wherein at least one of the nanostructures has a projected portion on an upper surface of the substrate and a circle equivalent diameter of the projected portion is about $(4A/\pi)^{1/2}$, where A is an area of the projected portion; and
a light filter layer over the nanostructures.

18. The device of claim 17, wherein the circle equivalent diameter of the projected portion is in a range from about 100 nm to about 1900 nm.

19. The device of claim 17, wherein the nanostructures are arranged in a hexagonal arrangement, an octagonal arrangement, a triangular arrangement, or combinations thereof.

20. The device of claim 17, further comprising a dielectric layer over the nanostructures, wherein the light filter layer is over the dielectric layer.

* * * * *